United States Patent
Angyal et al.

(10) Patent No.: US 7,480,605 B2
(45) Date of Patent: Jan. 20, 2009

(54) TECHNIQUES FOR DETERMINING PARAMETER VARIABILITY FOR INTERCONNECTS IN THE PRESENCE OF MANUFACTURING UNCERTAINTY

(75) Inventors: Matthew Stephen Angyal, Stormville, NY (US); Alina Deutsch, Chappaqua, NY (US); Ibrahim M. Elfadel, Ossining, NY (US); Zhichao Zhang, Tempe, AZ (US)

(73) Assignee: International Business Machines Corporation, Armonk, NY (US)

( * ) Notice: Subject to any disclaimer, the term of this patent is extended or adjusted under 35 U.S.C. 154(b) by 346 days.

(21) Appl. No.: 11/037,531

(22) Filed: Jan. 18, 2005

(65) Prior Publication Data

US 2006/0161412 A1    Jul. 20, 2006

(51) Int. Cl.
*G06F 17/50* (2006.01)
(52) U.S. Cl. .................. 703/14; 703/13; 703/6; 716/1; 716/2; 716/10; 716/6; 438/692
(58) Field of Classification Search .............. 703/14, 703/6, 13; 716/2, 10, 1, 6; 714/700; 101/130; 702/179, 65; 438/692; 324/658
See application file for complete search history.

(56) References Cited

U.S. PATENT DOCUMENTS

| | | | |
|---|---|---|---|
| 6,018,623 A * | 1/2000 | Chang et al. | 716/6 |
| 2002/0107647 A1* | 8/2002 | Anderson et al. | 702/65 |
| 2004/0024576 A1* | 2/2004 | Meuris et al. | 703/6 |
| 2004/0216067 A1* | 10/2004 | Tanaka et al. | 716/10 |
| 2004/0244613 A1* | 12/2004 | Barajas et al. | 101/130 |
| 2005/0027476 A1* | 2/2005 | Lim | 702/179 |
| 2005/0132306 A1* | 6/2005 | Smith et al. | 716/1 |
| 2005/0149777 A1* | 7/2005 | Yuan et al. | 714/700 |
| 2005/0196964 A1* | 9/2005 | Smith et al. | 438/692 |
| 2005/0206394 A1* | 9/2005 | Arora et al. | 324/658 |
| 2006/0101355 A1* | 5/2006 | Ciplickas et al. | 716/2 |

OTHER PUBLICATIONS

Zhang et al., "Yield analysis and optimization of VLSI interconnects in multichip modules", IEEE 1993.*

Wonnacott et al., "Introductory Statistics for Business and Economics", John Wiley $ Sons, Inc, Copyright, 1972.*

(Continued)

*Primary Examiner*—Kandasamy Thangavelu
(74) *Attorney, Agent, or Firm*—Harrington & Smith, PC

(57) ABSTRACT

Techniques are disclosed for determination of parameter variability for one or more given interconnects of a plurality of interconnects in a simulated semiconductor circuit. The simulated semiconductor circuit is defined at least in part by a plurality of input parameters. From a distribution of first values of a given input parameter, a plurality of the first values are determined to use when calculating a corresponding plurality of second values for each of one or more output parameters. By using at least the determined plurality of first values for the given input parameter and selected values for other input parameters in the plurality of input parameters, the corresponding plurality of second values are calculated for each of the one or more output parameters. The one or more output parameters correspond to the one or more given interconnects. Each of the second values corresponds to one of the determined plurality of first values.

21 Claims, 16 Drawing Sheets

OTHER PUBLICATIONS

Eshbaugh et al., "Generation of correlated parameters for statistical circuit simulation", IEEE 1992.*
Seifi et al., "Probabilistic design of Integrated circuits with correlated input pasrameters", IEEE 1999.*

U.S. Appl. No. 10/690,238, M. Anand, M. Angyal, A. Deutsch, A. Elfadel, G. Kopcsay, B. Rubin and H. Smith, entitled "Computer And Design Method And Apparatus for Modeling and Analyzing On-Chip Interconnect Structures".

* cited by examiner

```
File
****************************************************************
              Run 1  ---  2D Capacitance results
****************************************************************
   Layer           Variable 1      Variable 2     Cleft (pF/cm)   Capaci
                                                                  Crigh
M3 over M2 under M4  0.169608       0.100000       0.4948250
                     0.165811       0.108370       0.4855050
                     0.175000       0.105005       0.5072570
                                                   0.5069480
****************************************************************
Mean value of total capacitance for totThick is: 1.46835
Tolerance (3 Sigma) of total capacitance totThick is: 0.0265801
****************************************************************
Mean value of total capacitance for sigWidth is: 1.5171
Tolerance (3 Sigma) of total capacitance for sigWidth is: 0.032541
****************************************************************

Calculation finished successfully.
End time: Wed Jul 28 14:00:12 2004
```

FIG.13

```
File
******************************************************************
         Run 1 --- 2D Capacitance results
******************************************************************

Layer            Variable 1    Variable 2    Cleft (pF/cm)    Capaci
                                                                 Crigh M3 over M2 under M4   0.188220     0.110883      0.5379260
                                   0.110894      0.5379260
                      0.185416     0.110883      0.5308870
                                   0.110894      0.5308870
******************************************************************
Mean value of total capacitance is: 1.80993
Tolerance (3 Sigma) of total capacitance is: 0.0244047
******************************************************************

Calculation finished successfully.
End time: Wed Jul 28 14:03:04 2004
```

FIG.14

TECHNIQUES FOR DETERMINING PARAMETER VARIABILITY FOR INTERCONNECTS IN THE PRESENCE OF MANUFACTURING UNCERTAINTY

TECHNICAL FIELD

This invention relates generally to modeling of semiconductor circuits and, more specifically, relates to modeling of parameters for interconnects in semiconductor circuits.

BACKGROUND OF THE INVENTION

A variety of tools exists to help designers when laying out and creating semiconductor circuits. For instance, certain tools allow a designer to connect logic blocks and determine simulated electrical circuitry into which the logic blocks are placed. These tools can also perform layout of the simulated electrical circuitry to create simulated semiconductor circuits and perform simulation using the simulated semiconductor circuits. Additional tools can convert a schematic of the simulated semiconductor circuits into information used during processing to manufacture a semiconductor circuit.

In the past, tools mainly considered design parameters for a simulated semiconductor circuit. Such design parameters included, for instance, length for interconnects, thickness of interconnects, cross-section of interconnects, thickness of metal or insulating layers, properties of materials used for metal or insulating layers, and the like. The design parameters were used during analysis of a simulated semiconductor circuit to determine output parameters such as electrical parameters (e.g., resistance and capacitance) of interconnects in the simulated semiconductor circuit or performance parameters (e.g., delay, transition time, power, area, crosstalk) of interconnects in the simulated semiconductor circuit. These analyses proved helpful, especially as power requirements kept decreasing but speed requirements kept increasing. Furthermore, testing of semiconductor circuits were performed to determine how well the analysis of simulated semiconductor circuits agreed with data from the semiconductor circuits.

Recently, new tools have been developed that not only analyze design parameters for a semiconductor circuit but also analyze certain process parameters for the processes able to manufacture the semiconductor circuit. Such process parameters, e.g., as via thickness, dielectric constants, metal thickness, and the like, can influence the operation of the semiconductor circuit. Thus, not only can design parameters be used during analysis of a semiconductor circuit, but certain process parameters may also be taken into account during analysis of a semiconductor circuit.

While such tools used for analysis provide benefits, additional benefits could be realized if the tools had certain improvements.

BRIEF SUMMARY OF THE INVENTION

The present invention provides techniques for determining parameter variability in the presence of manufacturing uncertainty.

For instance, methods, apparatus, and signal bearing media are disclosed for determination of parameter variability for one or more given interconnects of a plurality of interconnects in a simulated semiconductor circuit. The simulated semiconductor circuit is defined at least in part by a plurality of input parameters. From a distribution of first values of a given input parameter, a plurality of the first values are determined to use when calculating a corresponding plurality of second values for each of one or more output parameters. By using at least the determined plurality of first values for the given input parameter and selected values for other input parameters in the plurality of input parameters, the corresponding plurality of second values are calculated for each of the one or more output parameters. The one or more output parameters correspond to the one or more given interconnects. Each of the second values corresponds to one of the determined plurality of first values.

As another example, an apparatus is disclosed for determination of parameter variability for one or more given interconnects of a plurality of interconnects in a simulated semiconductor circuit, where the simulated semiconductor circuit is defined at least in part by a plurality of input parameters. The apparatus comprises a graphical user interface (GUI) adapted to allow a user to select a nominal analysis or a statistical analysis. The apparatus also comprises a modeling tool. In response to a statistical analysis being selected, the modeling tool determines, from a distribution of first values of a given input parameter, a plurality of the first values to use when calculating a corresponding plurality of second values for each of one or more output parameters. Also in response to the statistical analysis being selected, the modeling tool calculates, by using at least the determined plurality of first values for the given input parameter and selected values for other input parameters in the plurality of input parameters, the corresponding plurality of second values for each of the one or more output parameter. The one or more output parameters correspond to the one or more given interconnects, and each of the second values corresponds to one of the determined plurality of first values. The modeling tool is further adapted to perform the following steps in response to a nominal analysis being selected: selecting nominal values for the plurality of input parameters; and determining, by using the selected nominal values, a value for each of the one or more output parameters.

BRIEF DESCRIPTION OF THE DRAWINGS

The foregoing and other aspects of embodiments of this invention are made more evident in the following Detailed Description of the Invention, when read in conjunction with the attached Drawing Figures, wherein:

FIG. 13 shows an exemplary representation of an output parameter presentation for an output parameter of capacitance, the output parameter determined using an independent variable analysis;

FIG. 14 shows an exemplary representation of an output parameter presentation for an output parameter of capacitance, the output parameter determined using either a simultaneous variable analysis or a full matrix variable analysis;

DETAILED DESCRIPTION OF EXEMPLARY EMBODIMENTS

Figure 1:
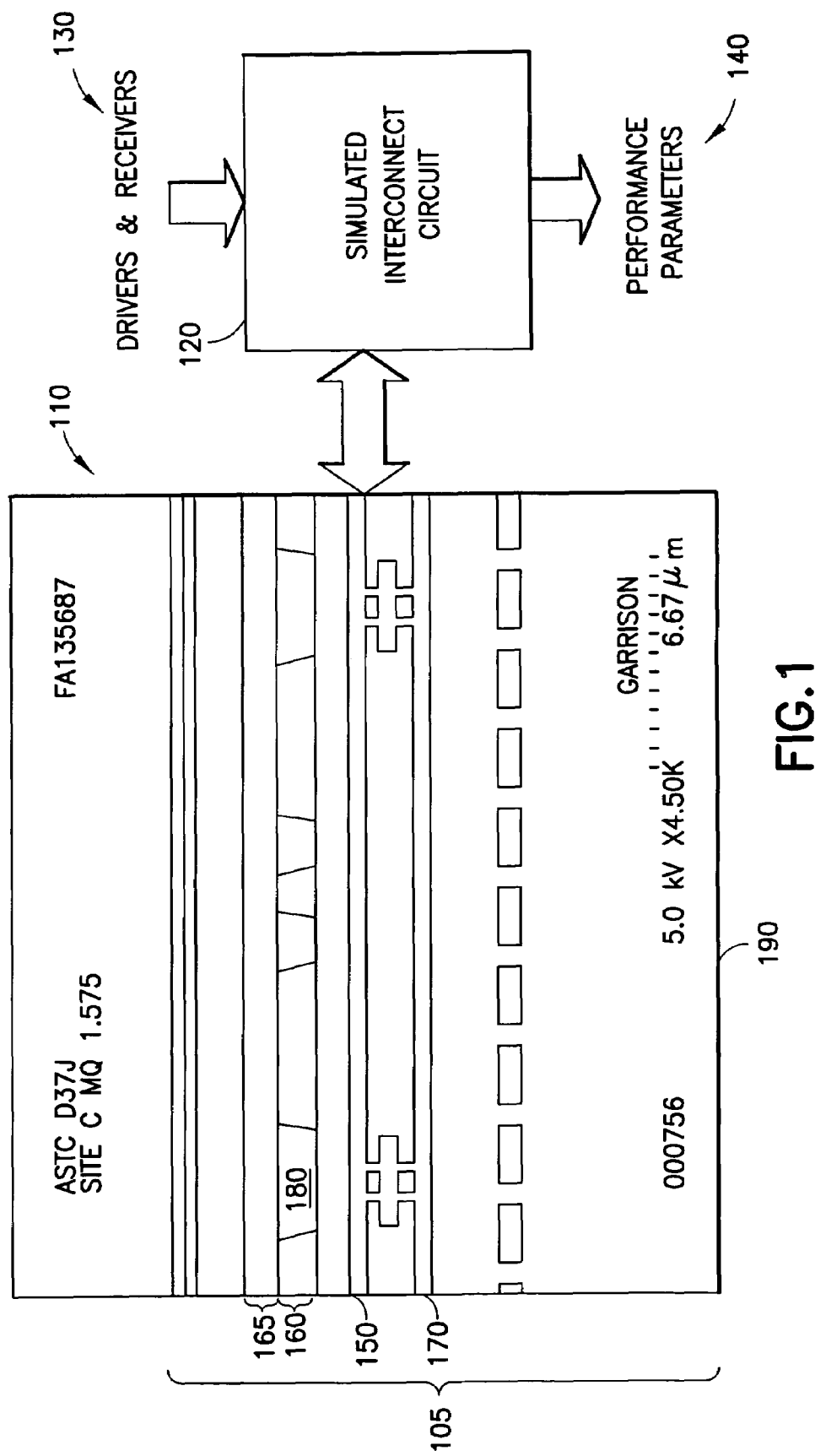
FIG. 1 is an exemplary diagram of a cross-section of an interconnect circuit and of a simulated interconnect circuit corresponding to the interconnect circuit.

As previously described, there are current tools used to analyze simulated semiconductor circuits. A semiconductor circuit can generally be divided into a front end of line (FEOL) portion and a back end of line (BEOL) portion. The present invention is primarily concerned with the BEOL portion, which will be referred to as an interconnect circuit. The description below focuses on the interconnect circuit, although it is to be understood that the present invention is applicable to semiconductor circuits. Current tools typically use nominal values for each of the input parameters (e.g., design parameters and process parameters) for analysis. Thus, output parameters for a simulated interconnect circuit are determined using nominal values for input parameters. Additionally, tools might provide output parameters corresponding to worst-case or best-case values for input parameters. However, during manufacturing, process parameters are rarely at their nominal, worst-case, or best-case values.

In particular, process parameters affect design parameters. For instance, a design parameter might be that an interconnect should be a particular width. Because of variations of the processes used to form the interconnect, the interconnect may not have the exact specified width and may, instead, be smaller or larger than the specified width. While process parameters can take into account the variation in width of the interconnect, in conventional modeling tools, only nominal (and perhaps worst-case or best-case) values are used for process parameters.

Furthermore, industrial technology design manuals list only tolerances for sheet resistance and via resistance for conductors, and no tolerances for interconnect capacitance are listed. Thus, there is an inability to compute tolerances for resistance-capacitance (RC) time constants for interconnects.

Moreover, current tools typically ignore correlation between process parameters, such as BEOL parameters. For instance, in the copper dual damascene process, the thickness of the metal line and the thickness of the via above the metal line are correlated random variables because of the etching process common to both. However, no current tools take the correlation into account.

By contrast, exemplary embodiments of the present invention can provide analysis of parameter variability for interconnects. For instance, for output parameters such as electrical parameters (e.g., capacitance, resistance, resistance-capacitance constant, impedance, inductance, and resistance as a function of frequency) and performance parameters (e.g., delay, transition time, power, area, crosstalk) for interconnects in a simulated interconnect circuit, certain exemplary embodiments of the present invention can account for process variability around nominal values for process parameters, which leads to variability around design parameters. For instance, a distribution for an input parameter can be selected by a user (e.g., or through other input) and values from the distribution selected for use in analysis. The distribution for the input parameter will be referred to as an "input" distribution herein. The analysis will then result in output parameters that also have some distribution, called an "output" distribution herein. Thus, a statistical analysis is performed in an exemplary embodiment. Typically, the selection of the values from the input distribution is automatically performed, through the use of statistical techniques. However, the user is also allowed to select values of the input distribution.

Other exemplary embodiments of the present invention can analyze correlation between input parameters such as BEOL process parameters. Additional exemplary embodiments allow a user to choose between a statistical analysis or a "nominal" analysis, where nominal values (and perhaps best-case and worst-case values) are used for input parameters.

Turning now to FIG. 1, an exemplary diagram is shown of a cross-section 110 of an interconnect circuit 105 and a simulated interconnect circuit 120 corresponding to a portion of the interconnect circuit 105. As previously described, the interconnect circuit 105 is a BEOL portion of a semiconductor circuit. The FEOL portion (not shown) of the semiconductor circuit typically comprises transistors (not shown) and other elements (not shown) that are below the bottom 190 of the cross-section 110. The interconnect circuit 105 comprises a number of conductive (typically metal) layers 150, 170, conductive areas 180, insulation areas 160, and insulating layers 165. The interconnect circuit 105 is manufactured using one or more processes (not shown) known to those skilled in the art. It is variation in the processes that cause variation between interconnect circuits 105 formed by the processes.

The interconnect circuit 105 is an end result of a series of design steps. One exemplary design step occurs when the simulated interconnect circuit 120 is created in a tool providing layout capability. The layout tool may also comprise a simulation portion. The simulation portion allows drivers and receivers 130 to be simulated to provide input to the simulated interconnect circuit 120 and to determine output parameters such as performance parameters 140. The drivers and receivers 130 are simulations of the FEOL portion of the semiconductor circuit. The simulation portion allows the simulated interconnect circuit 120 to be finalized before the costly endeavor of creating the interconnect circuit 105 and its corresponding semiconductor circuit is performed. Typically, in another design step, another tool will convert data from the layout tool to information used during the manufacturing process to create the interconnect circuit 105. The manufacturing process (which itself can comprise multiple processes) is then used to create the interconnect circuit 105. As is known in the art, typically many semiconductor circuits are created on one semiconductor die, and the semiconductor die is split into individual semiconductor portions having one or more semiconductor circuits provided thereon.

The interconnect circuit 105 is defined at least in part by design parameters (not shown in FIG. 1) such as length for interconnects, thickness of interconnects, cross-section of interconnects, thickness of metal or insulating layers, properties of materials used for metal or insulating layers, and the like. The design parameters define the simulated interconnect circuit 120 and with no process variations, also define the interconnect circuit 105. Such design parameters can be automatically created (e.g., by a tool that converts simulated interconnect circuit 120 to information used during the manufacturing process to create the interconnect circuit 105) or may be input by a user though a visual tool or a text tool or some combination thereof.

The simulated interconnect circuit 120 is used to simulate a number of different output parameters such as performance parameters 140. Performance parameters 140 can include delay, transition time, power, area, and crosstalk. Output parameters may also include electrical parameters (not shown in FIG. 1). Consequently, electrical parameters such as capacitance (C), resistance (R), RC time constant, impedance (Z), inductance (L), and functions of these as frequencies vary, may also be determined.

As described above, certain embodiments of the present invention allow process parameters and design parameters to be input parameters used during analysis of a simulated interconnect circuit. The input parameters can be considered to be independent or dependent (i.e., correlation may be performed on dependent input parameters). Output parameters corresponding to interconnects in the simulated interconnect circuit can be determined. Output parameters can be electrical parameters and performance parameters for interconnects in the simulated interconnect circuit.

Figure 2:
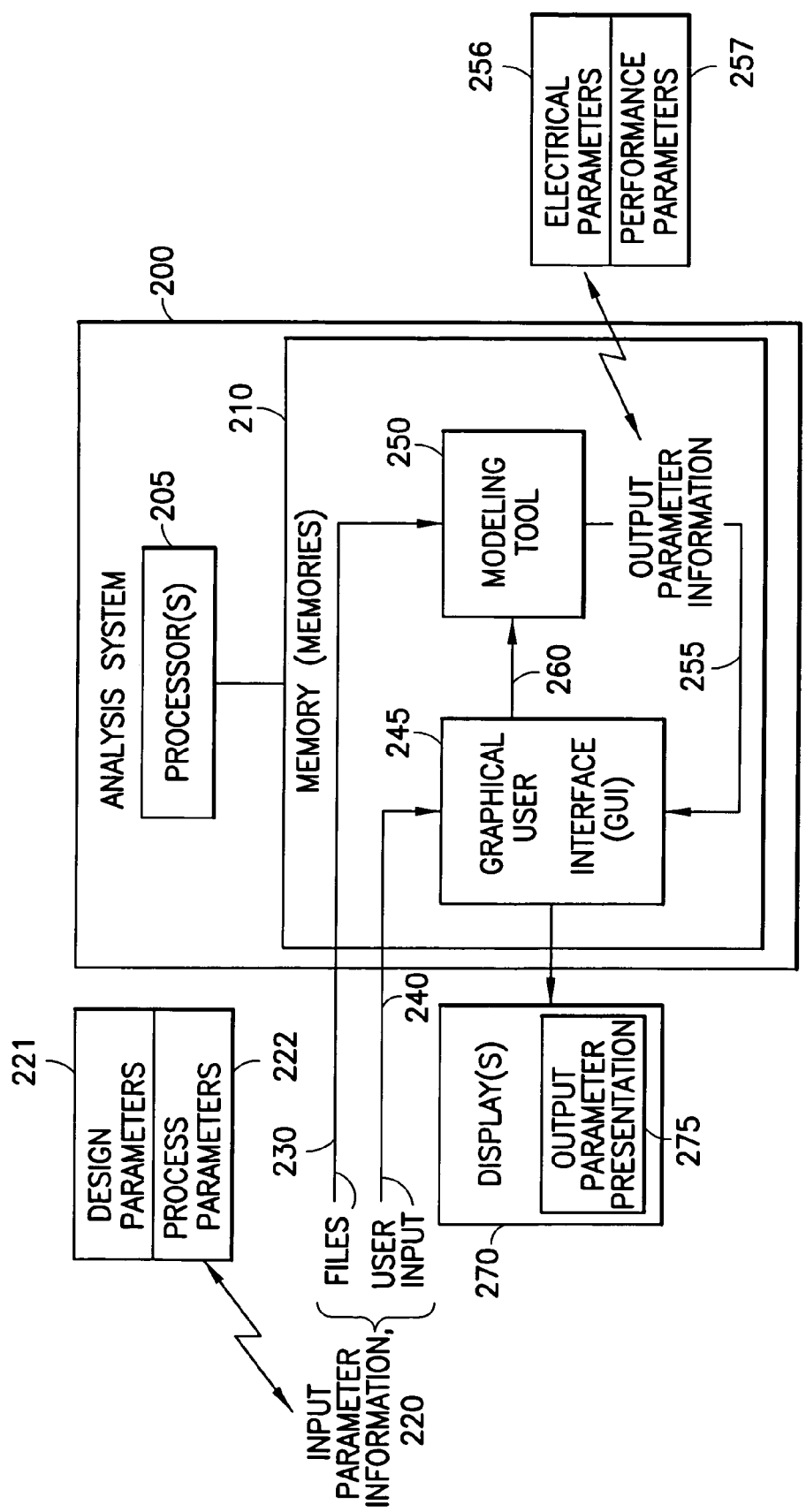
FIG. 2 is a block diagram of an exemplary analysis system operating in accordance with an illustrative embodiment of the present invention.

Referring now to FIG. 2, a block diagram of an exemplary analysis system 200 is shown operating in accordance with an illustrative embodiment of the present invention. Analysis system 200 is shown accepting input parameter information 220 (e.g., information about design parameters 221 and process parameters 222) and providing output to one or more displays 270. Analysis system 200 comprises one or more processors 205 coupled to one or more memories 210. The one or more memories 210 comprise a modeling tool 250 and a graphical user interface (GUI) 245. The input parameter information 220 may be entered into the one or more memories 210 through techniques such as files 230 or user input 240 through the GUI 245. The GUI 245 provides screens (described below in reference to FIGS. 5-12) that allow a user to perform selections regarding the input parameters 220. The GUI 245 interprets user input and determines data defining some of the input parameter information 220. The data is communicated to the modeling tool 250 through connection 260, such as an application programming interface (API). The files 230 also contain data defining some of the input parameter information 220.

The input parameter information 220 can include values corresponding to the input parameters. For instance, an input parameter could be width of an interconnect and values for the width will typically be included in the data passed to the modeling tool 250. The modeling tool 250 uses the data about the input parameter information 220 to produce output parameter information 255 (e.g., electrical parameters 256 and performance parameters 257). The output parameter information 255 corresponds to an interconnect in a simulated interconnect circuit that is being analyzed. An interconnect is any conductive element in the simulated interconnect circuit. An interconnect could be, as non-limiting examples, a metal wire, a via, a metal run, an entire metal layer, and a polysilicon portion.

The design parameters 221 are those parameters over which a designer of a simulated interconnect circuit has control. For instance, the designer can typically (e.g., using modeling tool 250) fix width of interconnects, thickness of metal layers, thickness of insulating layers, interconnect layout, and the like, depending on implementation. The design parameters 221 therefore define characteristics of the simulated interconnect circuit. Process parameters 222, on the other hand, are parameters of one or more processes used to form an interconnect circuit and are parameters the simulated interconnect circuit designer typically cannot control during processing. Such process parameters include dielectric constants, metal resistivities, and the like. Depending on implementation, the process parameters 222 may include types of conductive and insulating materials used and thickness of insulating layers.

The process parameters 222 therefore define how the characteristics of the simulated interconnect circuit change in response to one or more processes used to manufacture an interconnect circuit from the simulated interconnect circuit. For example, a designer will fix the design parameters 221 and the process parameters 222 will then act to modify the fixed design parameters. Therefore, the designer might choose that an interconnect is to be X in width, and the process parameters 222 might then dictate that the width of the interconnect will not be X but will instead be a some other value. The designer may also choose to have certain design parameters 221 be default values. For example, the designer may choose that certain insulating layers are to be default thicknesses. The process parameters 222 can then modify the default thickness and also properties of the default materials. Because this modification is statistical in nature, exemplary embodiments of the present invention use statistical techniques to vary the default thickness and properties of the default materials.

Typically, a simulated integrated circuit designer will examine, input, and change design parameters 221, while a process engineer will examine, input, and change process parameters 222. However, in an exemplary embodiment, any user of analysis system 200 can change any input parameter. In other embodiments, designers are limited to examining, inputting, and changing only design parameters 221, while process engineers are limited to examining, inputting, and changing only process parameters 222.

It should be noted that variability may be used for both design parameters 221 and process parameters 222. A user may therefore choose that a design parameter 221 of a width of an interconnect will be described by a distribution of values having a mean and a tolerance. Alternatively, process parameters 222 that affect the variability of the width of the interconnect may be defined and described by another distribution of values. In the latter case, if the process parameters 222 that affect the variability of the width of the interconnect can be adequately defined, then typically no distribution of values would be used for the design parameter 221 of width of the interconnect, as the variability in width occurs because of the variability in the processes.

It should be noted that the design parameters 221 and process parameters 222 affect a simulated interconnect circuit. There may be differences between the simulated interconnect circuit and an interconnect circuit created by the processes.

The GUI 245 presents the output parameter information 255 to the user through the output parameter presentation 275 on the one or more displays 270. Exemplary screens having output parameter presentations 275 are shown in FIGS. 13-16.

The one or more processors 205 and one or more memories could be singular (e.g., a single processor 205 and a single memory 210 in one container) or distributed (e.g., multiple processors 205 and one or more memories 210 in one container or multiple containers connected through one or more networks, where each container has one or more processors 205 and one or more memories 210). Each of the one or more memories 210 can comprise volatile memories, non-volatile memories, or both. As is known in the art, the analysis system 200 can comprise signal bearing medium tangibly embodying a program of machine-readable instructions executable by a digital processing apparatus (e.g., the one or more processors 205) to perform operations to carry steps associated with embodiments of the present invention.

Figure 3:
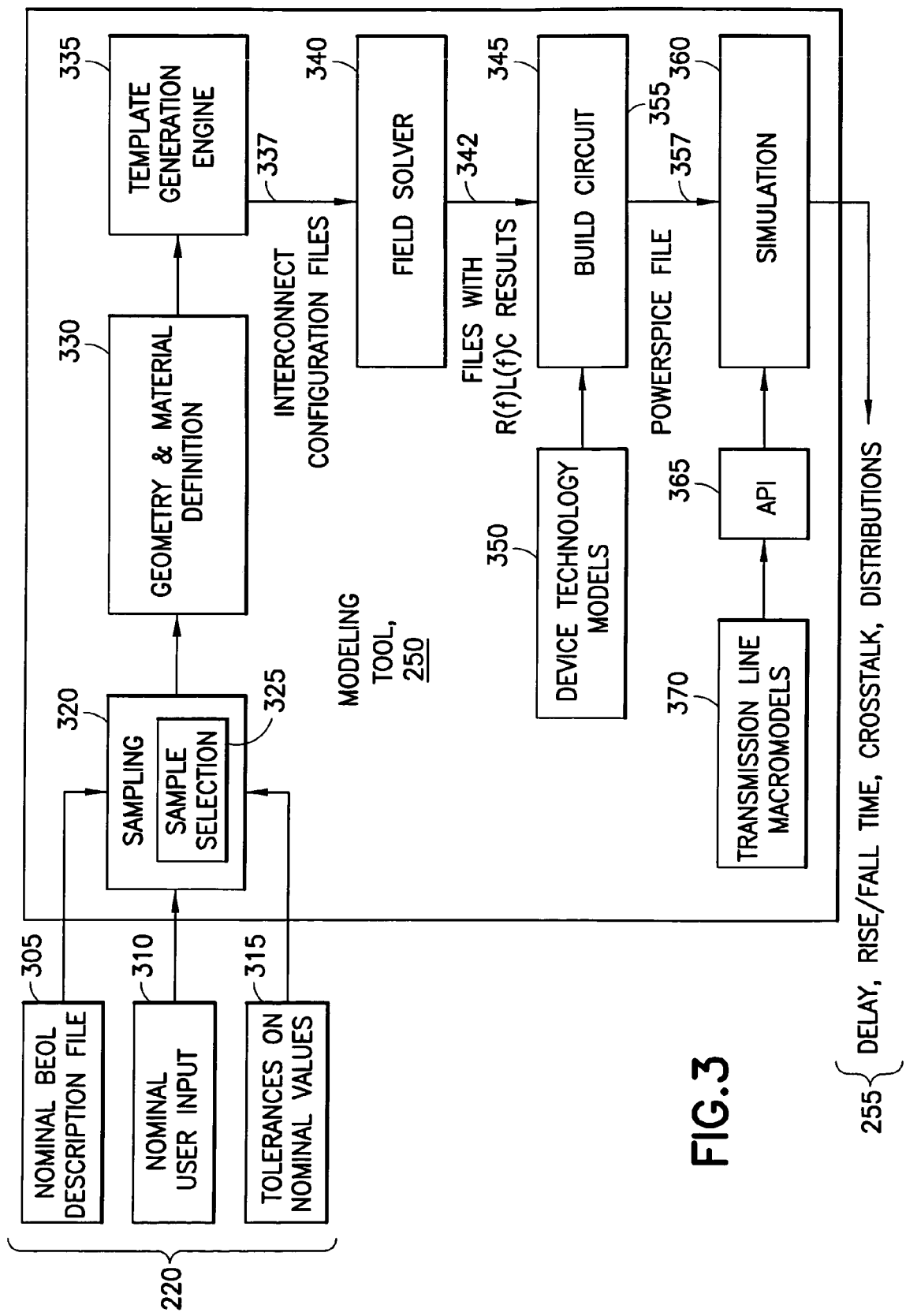
FIG. 3 is a block diagram of an exemplary modeling tool operating in accordance with an illustrative embodiment of the present invention.

Turning to FIG. 3 with appropriate reference to FIG. 2, an exemplary modeling tool 250 is shown operating in accordance with an illustrative embodiment of the present invention. Modeling tool 250 is shown accepting exemplary input parameter information 220 of a nominal BEOL description file 305, a nominal user input 310, and tolerances on nominal values 315. The nominal BEOL description file 305 contains information about process parameters 222 for processes for forming a particular interconnect circuit. The file 305 would typically be part of files 230. The nominal user input 310 contains nominal values for design parameters 221 and for process parameters 222. The nominal user input 310 will typically be at least partly a file on files 230, although as is described below, user input 240 may also typically define a portion of the nominal user input 310. The tolerances on nominal values 315 provides tolerances (described in more detail below) on the design parameters 221 or process parameters 222. Generally, the tolerances on nominal values 315 will be provided through the user input 240, although some or all of the tolerances on nominal values 315 could be provided through files 230.

The modeling tool 250 comprises a sampling module 320, a geometry and material definition module 330, a template generation module 335, a field solver 340, an interconnect technology models database 350, a build circuit module 345, a simulation module 360, an API 365, and a transmission line macromodels database 370. The sampling module 320 comprises a sampling selection module 325. The modeling tool 250 produces output parameter information 255, shown in this example as information about the performance parameters of delay, transition time (e.g., rise/fall time), and crosstalk. Typically, the information is in the form of distributions that can then be used by the GUI 245 to display output parameter presentations 275 to the user. For example, the output presentations 275 may comprise text (see FIGS. 13 and 14) and histograms (see FIGS. 15 and 16). The output parameter information 255 may also comprise information about electrical parameters, such as resistance, capacitance, RC time constant, impedance (Z), inductance (L), and functions of these as frequencies vary.

The geometry and material definition module 330 defines the geometry and materials used for a simulated interconnect circuit, and the definition is provided at least in part by design parameters 221 that are entered by a user. The template generation engine 335 produces interconnect configuration files 337. The field solver 340 produces files with resistance as a function of frequency, R(f), inductance as a function of frequency L(f), and capacitance, C, results 342. The build circuit 357 produces a powerspice file 357 in an exemplary embodiment, which is used by the simulation module 360 to simulate a simulated interconnect circuit.

The geometry and material definition module 330, template generation module 335, field solver 340, interconnect technology models database 350, build circuit module 345, simulation module 360, the API 365, and the transmission line macromodels database 370 are described in, for instance, U.S. patent application Ser. No. 10/690,238 by inventors M. Anand, M. Angyal, A. Deutsch, A. Elfadel, G. Kopcsay, B. Rubin, and H. Smith, entitled "Computer And Design Method and Apparatus for Modeling and Analyzing On-Chip Interconnect Structures," the disclosure of which is hereby incorporated by reference. In patent application Ser. No. 10/690,238, the nominal user input 310 and nominal BEOL description file 305 were applied to the geometry and material definition module 330, with passing through the sampling module 320. Additionally, in patent application Ser. No. 10/690,238, the nominal user input 310 typically contained only one nominal value for each of the input parameters in input parameter information 220, although worst-case and best-case values for each input parameter may also be used. Thus, the output parameter information 255 contained at most three sets of values corresponding to output parameters: (1) values corresponding to worst-case values for the input parameters; (2) values corresponding to nominal values for the input parameters; and (3) values corresponding to best-case values for the input parameters.

While the techniques in patent application Ser. No. 10/690, 238 are valuable, the present invention additionally provides sampling of values of input parameters in order to determine corresponding values for output parameters. For example, a user can select a distribution to use for each of the input parameters in input parameter information 220. Typical distributions are Gaussian or uniform distributions, although any other distribution may be used. Additionally, the same distribution is generally used for one or more of the input parameters, although optionally different distributions may be used for different input parameters.

The sampling module 320 then selects, using the distributions for the input parameters, a set of values for input parameters and communicates the set of values to the geometry and material definition module 330. The modeling tool 250 then performs calculations with the set of values to produce output parameters. The sampling module 320 will select another set of values and will communicate the new set of values to the geometry and material definition module 330. The modeling tool 250 then performs calculations with the new set of values to produce output parameters. This process is continued until all sets of values from the sampling module 320 have been used for calculations. The output parameter information 255 will comprise a distribution of values for each of the output parameters being analyzed.

There are a number of ways that the sampling module 320 can select sets of values for the input parameters. One beneficial technique is through the use of the sample selection module 325, which uses statistical analysis in addition to determining how many samples and which values for samples should be used. Such statistical analysis could be Monte Carlo analysis, such as described in J. E. Gentel, "Random Number Generation and Monte Carlo Methods," 2nd Edition, Springer, 2003, the disclosure of which is hereby incorporated by reference. To determine how many samples and which values for samples should be used, the Central Limit Theorem may be used. Optionally, a user can choose which values to use for one or more of the input parameters. Sampling and sample selection are described in more detail below.

Figure 4:
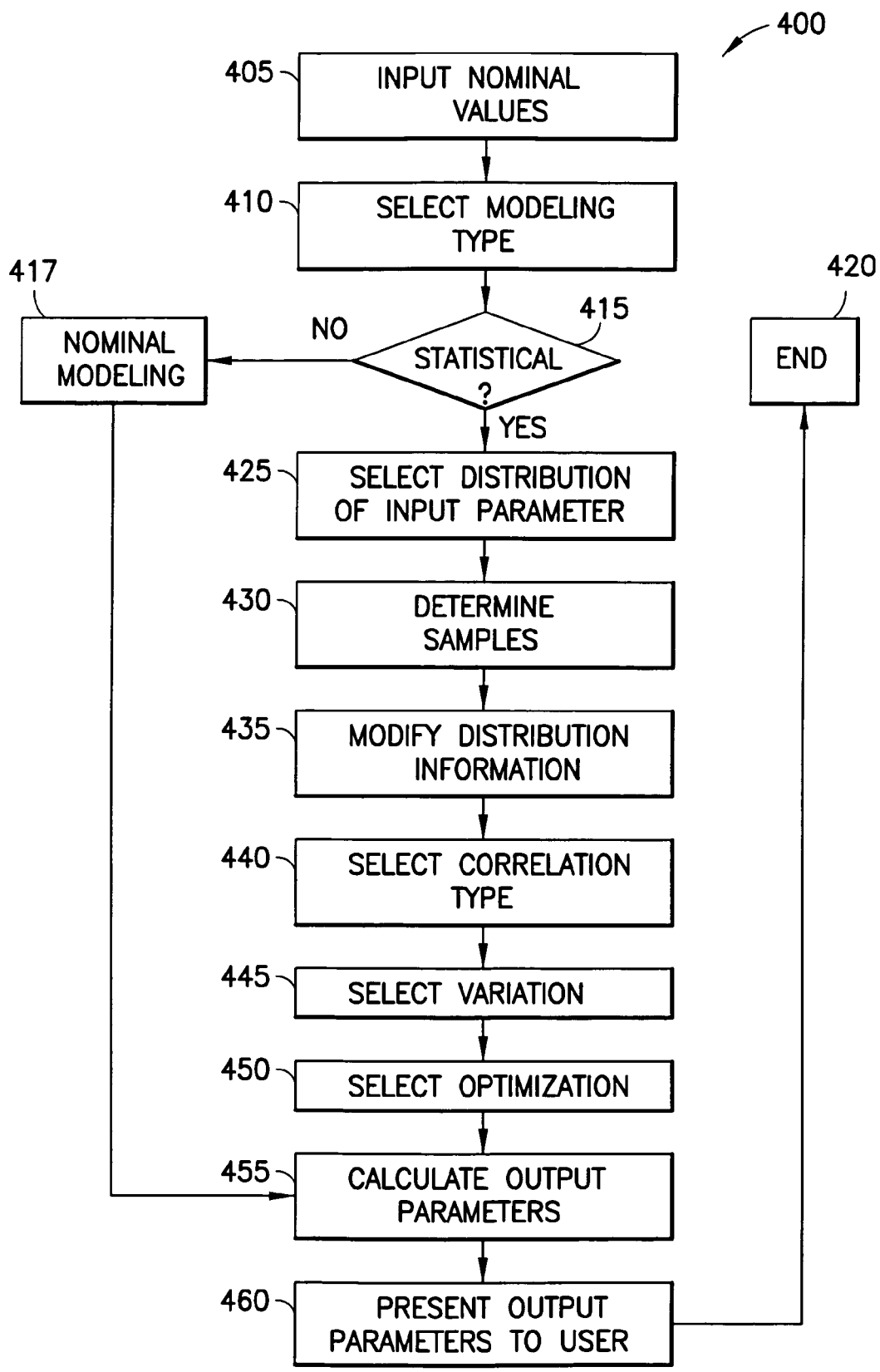
FIG. 4 is a flowchart of an exemplary method for analysis of parameters for interconnects in a simulated interconnect circuit.

Referring now to FIG. 4, a flowchart of an exemplary method 400 for analysis of parameters for interconnects in a simulated interconnect circuit. Method 400 begins in step 405, when a user inputs nominal values for input parameters (e.g., as part of nominal user input 310 of FIG. 3) for design parameters or process parameters or both. It should be noted that the geometry and material definition for a simulated interconnect circuit will typically already be input prior to step 405. Steps 410, 425, 430, 435, 440, 445, 450, 455, and 460 are generally performed by a user who is using one or more input screens of a GUI (e.g., GUI 245 of FIG. 2). Exemplary input screens (e.g., dialog boxes or windows) are shown in FIGS. 5-12. In step 410, a user selects whether nominal modeling or statistical modeling should be used. Step 410 is described in more detail in reference to FIG. 4.

If statistical modeling is not going to be performed (step 415=No), method 400 performs nominal modeling in step 417. Nominal modeling means that nominal values are associated with input parameters. In step 455, calculations are performed using the nominal values for the input parameters in order to determine output parameters. In step 417, best-case and worst-case values for input parameters may also be assigned. In this case, step 455 would perform three calculations, one calculation with nominal values, one with worst-case values, and one with best-case values for input parameters. In step 460, output parameters are presented to the user and the method 400 ends in step 420.

If statistical modeling is selected (step 415=Yes), the user may modify and input additional options. In the example of FIG. 4, for simplicity, one particular input parameter is selected. However, the user can select multiple input parameters, as described in more detail below. In step 425 (described in more detail in reference to FIG. 8), the user selects a distribution for the selected input parameter. Samples from the distribution are determined in step 430 (described in more detail in reference to FIGS. 8 and 9). Step 430 is typically performed automatically (e.g., by a sample selection module 325 of FIG. 3). However, as is described in more detail below, a user may also enter particular samples to use. As used herein, a "sample" corresponds to a value of an input parameter in a distribution for the input parameter.

In step 435 (described in more detail in reference to FIG. 9), a user may modify distribution information. For instance, if the distribution is Gaussian, a user may modify the tolerance (defined, for a Gaussian distribution as three times the standard deviation, σ). A nominal value for a distribution is assumed to be the mean of the Gaussian distribution. The mean of the Gaussian distribution may also be changed in step 435.

In step 440 (described in more detail in reference to FIG. 10), the correlation type is selected. Generally, no correlation between input parameters is assumed. However, the user may choose that input parameters are to be correlated.

In step 445, the user can select a variation. Typically, variable for input parameters will be modified independently of variable for other input parameters. However, variables for input parameters may be modified simultaneously, or a matrix of variables can be simulated. This is described in more detail in reference to FIG. 7A.

In step 450, optimization is selected. Optimization is described in more detail in reference to FIG. 11.

In step 455, calculations are performed using sets of values for input parameters. Each calculation produces a set of values for output parameters. Once all calculations are performed in step 455, a distribution (e.g., as part of output parameter information 255 of FIG. 2) of values for each output parameter has been determined. In step 460, the distributions are presented to the user (as shown in FIGS. 13-16).

Figure 5:
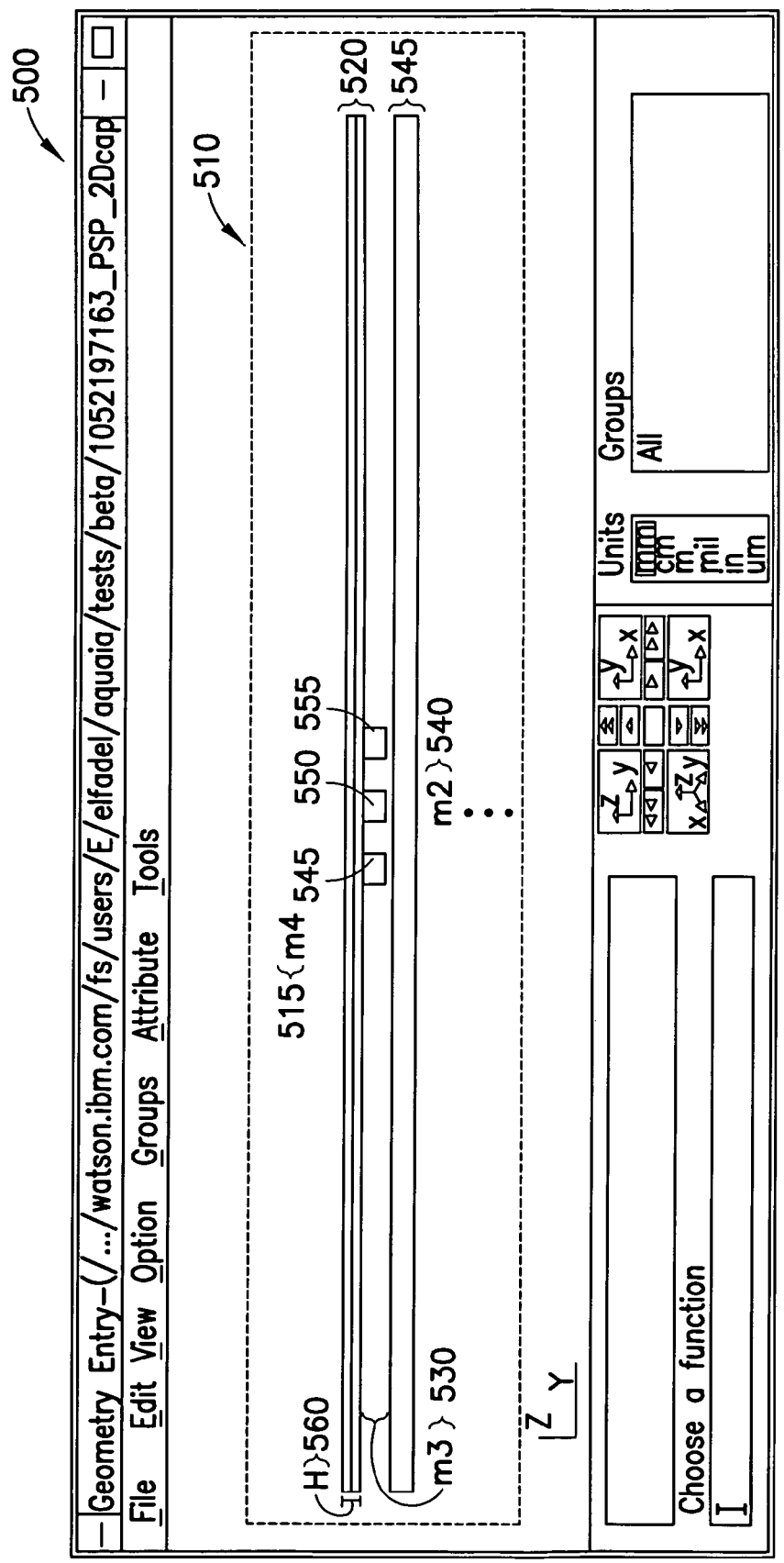
FIG. 5 is an exemplary representation of a graphical user interface (GUI) used to visualize interconnect configuration files.

FIG. 5 is an exemplary representation of a GUI 500 used to visualize interconnect configuration files 337 of FIG. 3. Representation 510 comprises metal layers M2 540, M3 530, and M4 515 and insulating layers 520 and 545 (each of which will typically comprise multiple layers). The representation 510, as those skilled in the art know, will comprise additional layers and the representation 510 is shown merely for exposition. In metal layer M3 530, three interconnects 545, 550, and 555 are shown. Each interconnect has already been given design parameters such as height, width, and cross-section, and the representation 510 allows a user to a simulated interconnect circuit defined by the design parameters (e.g., and process parameters).

FIG. 5 may also be used to illustrate that tolerances can affect output parameters. For instance, height 560 of the insulating layer 520 can affect capacitive coupling between the metal layer M3 530 and the metal layer M4 515. Thus, process variability can affect output parameters for the interconnects 545, 550, and 555 in metal layer M4 515. The height 560 (e.g., and type of material for the insulating layer 520) are typically defined by process parameters, although the height 560 may be a design parameter, depending on implementation.

One typical output parameter to be calculated might be the total capacitance of the center interconnect 550. The total capacitance can be calculated, for example, as the addition of the capacitance between the interconnects 550 and 555, the interconnects 550 and 545, the interconnect 550 and the metal layer M4 515, and the interconnect 550 and the metal layer M2 540.

Figure 6:
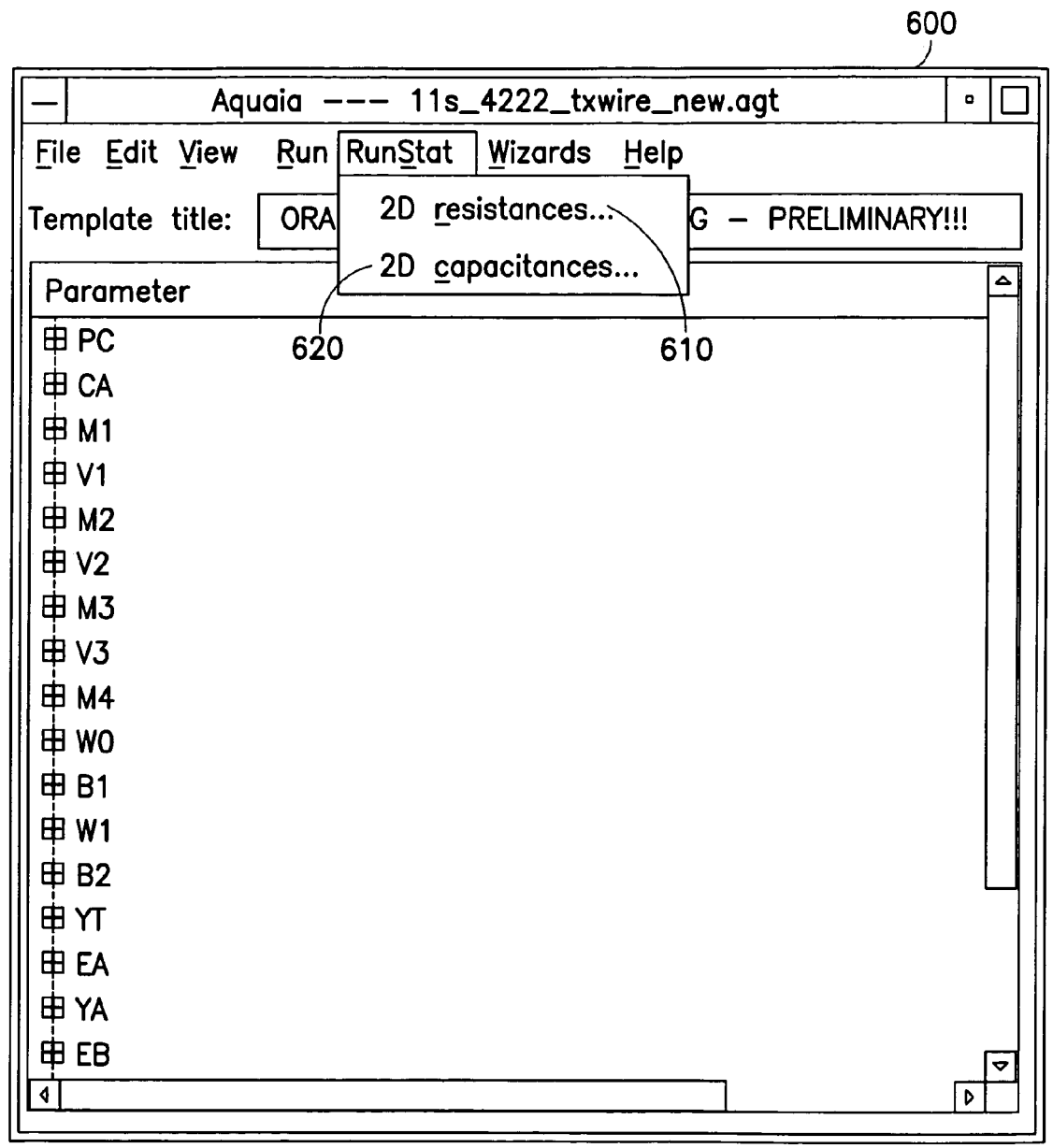
FIG. 6 is an exemplary representation of a main input screen of the GUI used to allow input of certain input parameters and analysis options corresponding to a simulated interconnect circuit.

Turning now to FIG. 6, an exemplary representation of a main input screen 600 is shown. Main input screen 600 is used to allow input of certain input parameters and analysis options corresponding to a simulated interconnect circuit (e.g., such as a simulated interconnect circuit defined by representation 510 of FIG. 5). Input screen 600 allows a user to select "2D resistances" menu command 610 or "2D capacitances" menu command 620, where "2D" stands for "two-dimensional." Each of the menu commands 610, 620 will cause another input screen to appear. Because the input screens for capacitance and resistance follow a similar arrangement pattern, and the capacitance dialog box is a little more complicated, the capacitance input screen will be described herein. In response to a user selecting the "2D capacitances" menu command 620, the input screen 700 of FIG. 7A is presented to the user.

Figure 7A:
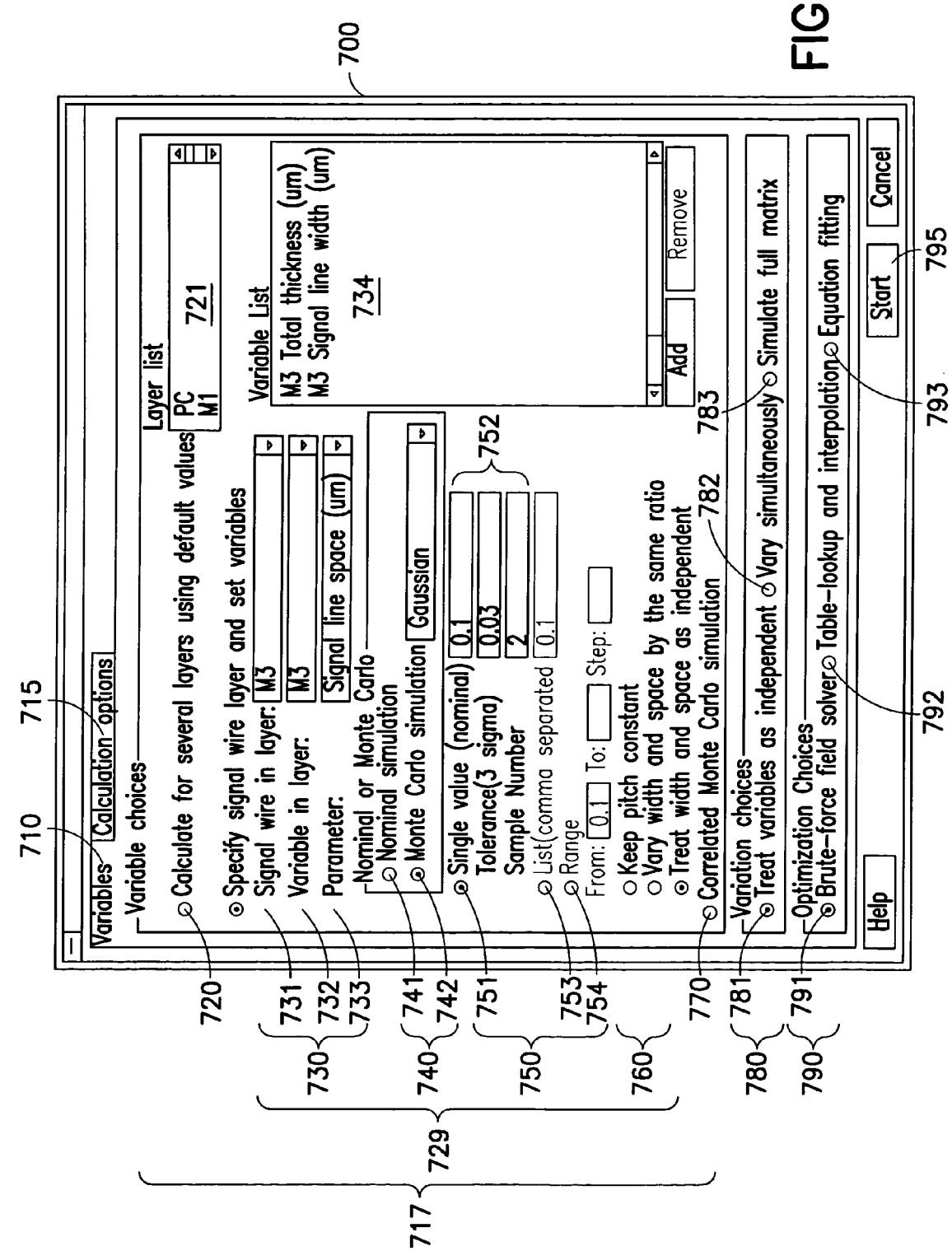
FIG. 7A is an exemplary representation of an input screen of a GUI used to select information about variables and calculations performed with respect to an output parameter associated with an interconnect of the simulated interconnect circuit.

FIG. 7A is an exemplary representation of an input screen 700 of a GUI used to select information about variables and calculations performed with respect to an output parameter associated with an interconnect of the simulated interconnect circuit. Input screen 700 comprises two tabbed pages 710 and 715. An exemplary version of the tabbed page 715 is shown in reference to FIG. 7B. The tabbed page 710 allows modification and input of information corresponding to a variable in a particular layer. A variable is an input parameter. Additionally, variables allow a layer, such as a metal layer, to be selected.

There are a number of variable choices 717. For instance, the radio button 720 can be selected, and selection of the radio button 720 will cause calculations to be performed for several layers (e.g., to be selected by the user from the layer list 721) using default values. A default value is a value automatically assigned to an input parameter and a nominal value can override the default value.

Alternatively, the user can select the radio button group 729, which will allow the user to specify a signal wire layer and set variables for that wire layer. For example, there are a set 730 of pulldown boxes 731, 732, and 733. Pulldown box 731 allows the user to select a particular metal layer having an interconnect for which values for output parameters are to be calculated. The selected layer in pulldown box 731 could be the interconnect for which values for output parameters are to be calculated. Alternatively, a user can select an interconnect using the calculation options tab 715. Pulldown box 732 allows a user to select a metal layer for which input parameters are to be selected. The pulldown box 733 allows an input parameter to be selected for the metal layer selected by pulldown box 732. In this example, the design parameter is "signal line spacing" in micrometers for the metal layer M3 selected by pulldown box 732. The variable list 734 shows input parameters that have already been selected. In this example, the total thickness and signal line width for the metal layer M3 have been selected.

In radio button group 740, two radio buttons 741, 742 may be selected. The radio button group 740 is described in more detail in reference to FIG. 8. The radio button group 750 allows choice of three radio buttons 751, 753, and 754. Selecting radio button 751 allows the group 752 to be selected. The group 752 is described in more detail in reference to FIG. 9. Radio button 753 allows a user to manually select a list of nominal values for an input parameter. Similarly, radio button 754 allows a user to provide a range of nominal values from an initial sample to a final sample, using input steps.

Figure 10:
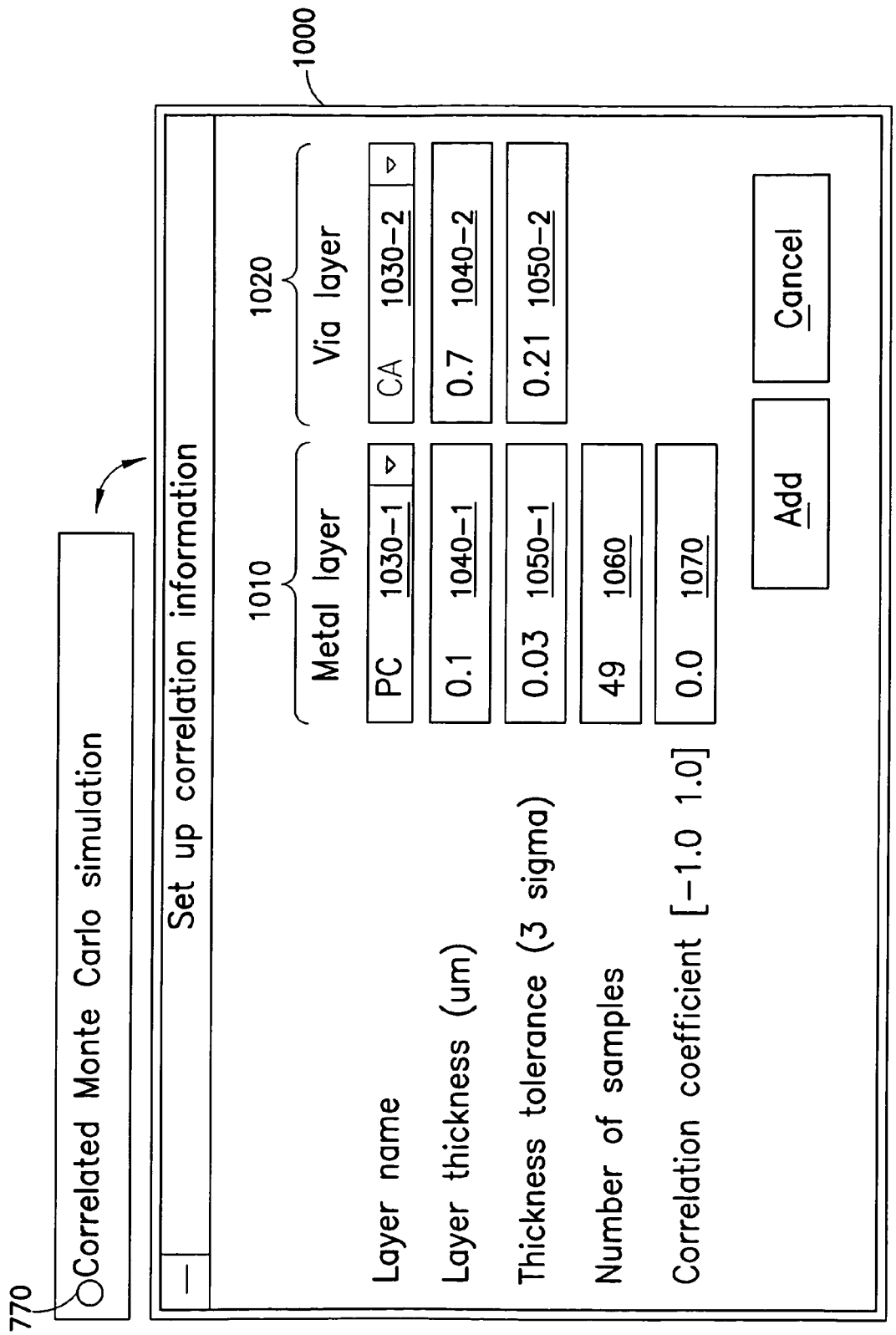
FIG. 10 shows an exemplary representation of a portion of the input screen of FIG. 7A, the portion used to modify distribution information, and also shows an exemplary representation of a screen used to input correlation information.

Radio button 770 allows a correlated Monte Carlo simulation to be performed, as described in further detail in reference to FIG. 10. Radio button group 780 allows a variation to be selected through choice of one of the radio buttons 781, 782, or 783. The radio button 781 causes each variable to be treated as independent. Radio button 782 causes certain variables to be simultaneously varied. Radio button 783 causes all variables to be solved in a full matrix.

The radio button group 790 allows a user to select radio buttons 791, 792, or 793. These are described in more detail in reference to FIG. 11. For a resistance calculation, the radio button group 790 typically will not be presented to the user.

The start button 795 starts calculations to solve for output parameters (see, e.g., step 455 of FIG. 4). Note that calculations for nominal modeling (step 417 of FIG. 4) or statistical modeling (steps 425-450 of FIG. 4) may be performed. Note also that, if desired, both nominal and statistical modeling may be performed (e.g., another radio button of "nominal and Monte Carlo simulation" could be added to radio button group 740).

Figure 7B:
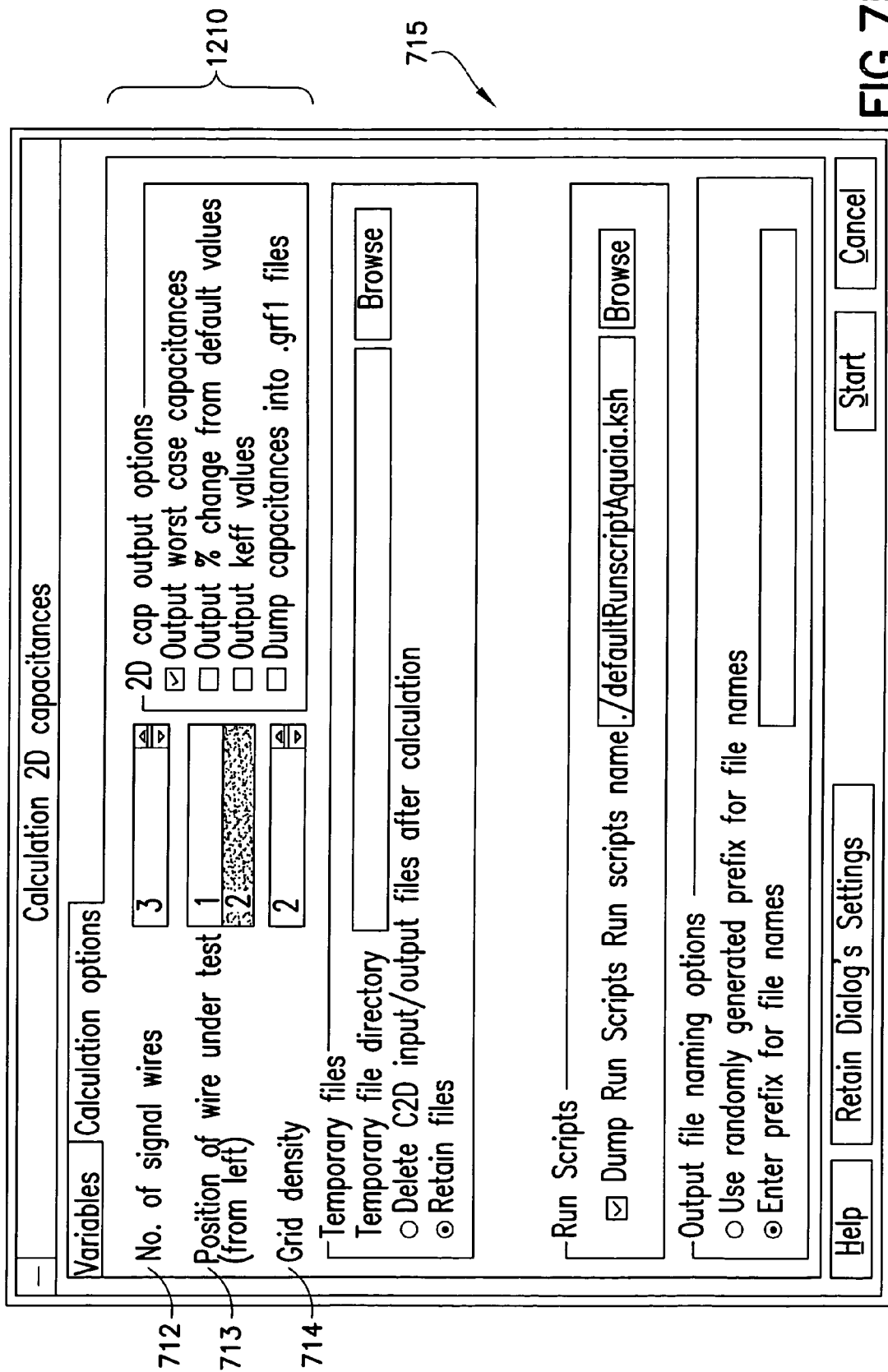
FIG. 7B is an exemplary representation of an input screen of a GUI used to select information about calculation options for calculations performed with respect to an output parameter associated with an interconnect of the simulated interconnect circuit.

FIG. 7B is an exemplary representation of an input screen 715 of a GUI used to select information about calculation options for calculations performed with respect to an output parameter associated with an interconnect of the simulated interconnect circuit. The calculation options shown are for capacitance and options for resistance would be similar. The calculation options include the number of signal wires 712, the position of a wire under test 713, the grid density 714, and two-dimensional (2D) capacitance options 1210 (described in more detail in reference to FIG. 12). Number of signal wires 712 selects the number of interconnects (e.g., wires in this example) that are involved in the capacitance calculation. The typical number is three, the central wire and the two neighboring wires. These wires get assigned unique numbers, say 1, 2, 3 from left to right. Then wire under test 13 may be used to select the specific wire, say 2, for which the capacitance value is to be calculated. Grid density 714 refers to a parameter used in the modeling tool (e.g., operating a field solver) that computes the capacitance based on the wiring geometry for instance.

Figure 8:
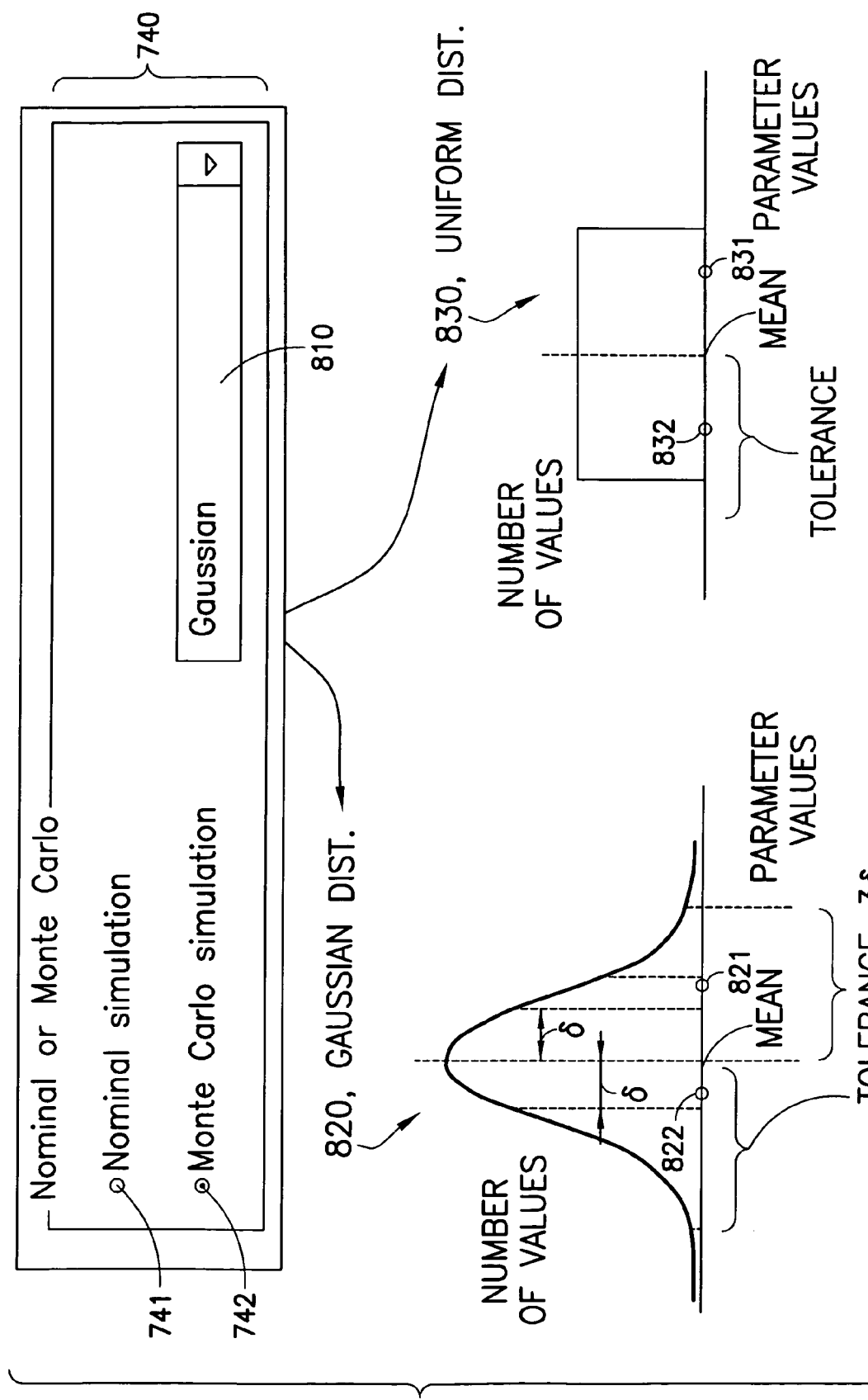
FIG. 8 shows an exemplary representation of a portion of the input screen of FIG. 7A, the portion used to select nominal or statistical analysis (e.g., or both), and also exemplary distributions used for input parameters.

FIG. 8 shows an exemplary representation of a portion of the input screen of FIG. 7A, the portion used to select nominal or statistical analysis (e.g., or both), and also exemplary distributions used for input parameters. Radio button group 740 has radio button 741 (for nominal simulation) and radio button 742 (for Monte Carlo simulation). When radio button 742 is selected, the dropdown box 810 is active and allows a user to select a distribution of values for an input parameter. A Gaussian distribution 820 is shown having a mean value, a standard deviation, $\sigma$, and a tolerance, $3\sigma$. The mean value is initially set as the nominal value, and there may be best-case and worst-case values that define beginning and ending values, respectively, for the Gaussian distribution 820. Two exemplary samples 821, 822 are shown. Note that samples 821, 831 need not be within the $3\sigma$ area of the Gaussian distribution 820. A uniform distribution 830 is shown having a mean and a tolerance, where the tolerance (together with the mean) defines the starting and ending values of the uniform distribution 830. The mean is initially a nominal value for the input parameter. Two exemplary samples 831, 832 are shown. The samples 831 and 832 are typically selected within a range defined by the mean and the tolerances. Although Gaussian and uniform distributions are shown, other distributions may be used, such as triangular and log-normal distributions. In an exemplary embodiment, srand( ) and rand( ) are random number generators used. Additionally, other random number generators may be used. As an example, a random generator from Park and Miller with Bays-Durham shuffle and added safeguard may be used. The polar form of Box-Muller transform may be used to normally distribute random numbers. The present invention is not limited to any particular random number generator.

Figure 9:
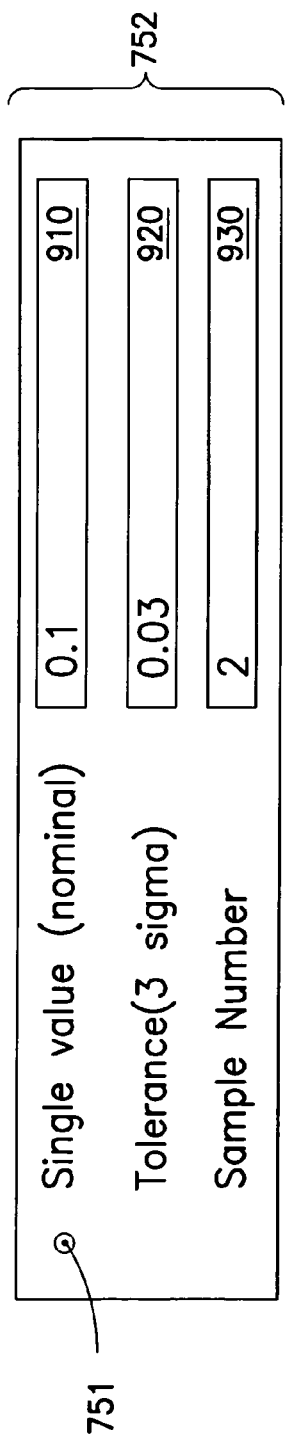
FIG. 9 shows an exemplary representation of a portion of the input screen of FIG. 7A, the portion used to modify distribution information.

FIG. 9 shows an exemplary representation of a portion of the input screen of FIG. 7A, the portion used to modify distribution information. FIG. 9 shows group 752, comprising boxes 910, 920, and 930. Box 910 allows a nominal value to be input or modified. The original value of 0.1 in the box 910 can come from the nominal user input 310 of FIG. 3, for instance. The nominal value in this example is the mean of the selected distribution. The box 920 allows the tolerance to be changed. The typical tolerance for a Gaussian distribution 820 will be $3\sigma$, and the tolerance (along with the mean) for a uniform distribution 830 will define the beginning and end of the uniform distribution. In an exemplary embodiment, the tolerance has a default value chosen as 30 percent of the nominal value.

Sample number 930 is initially automatically generated (e.g., by the sample selection module 325) and values for samples (e.g., samples 831 and 832) are typically automatically selected (e.g., by the sample selection module 325) through methods such as the Central Limit Theorem. The sample number is generated based on a confidence level. Optionally, a user can modify the number in box 930 to increase the number of samples selected.

FIG. 10 shows an exemplary representation of a portion (e.g., radio button 720) of the input screen of FIG. 7A, the portion used to modify distribution information, and also shows an exemplary representation of a screen 1000 used to input correlation information. In an exemplary embodiment, all the simulations provided under 'Specify signal wire layer and set variables' radio button group 729 are based on there being no correlation between different variable sets. To consider the impact of correlation between wire thickness and via thickness (for example), the user can choose the option 'Correlated Monte-Carlo simulation' using radio button 770. In response to a user selecting radio button 770, a new screen 1000 is presented. In this example, correlation is set up between metal layer 1010 and via layer 1020.

Screen 1000 comprises boxes 1030-1 and 1030-2 for layer name (although box 1030-2 is grayed out), boxes 1040-1 and 1040-2 for layer thickness, boxes 1050-1 and 1050-2 for thickness tolerance, box 1060 for number of samples, and box 1070 for correlation coefficient.

In the screen 1000, users can specify the metal layer under testing using box 1030-1. The via layer right above the selected metal layer is automatically correlated and shown in the second box 1030-2. Besides setting the nominal values, tolerances and sample numbers as in a non-correlated case, the user also needs to set a correlation coefficient using box 1070 between −1.0 and 1.0. The correlation coefficient accounts for how the etching process common to both layers will correlate the metal and via thickness.

Figure 11:
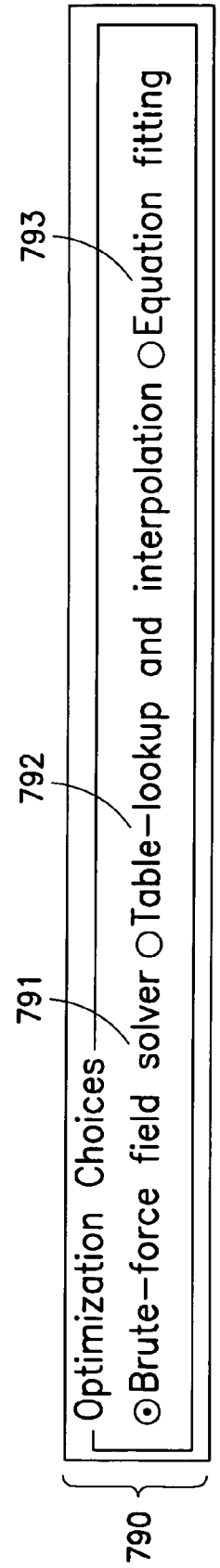
FIG. 11 shows an exemplary representation of a portion of the input screen of FIG. 7A, the portion used to select optimization.

Turning now to FIG. 11, an exemplary representation of a portion (e.g., radio button group 790) of the input screen of FIG. 7A, the portion used to select optimization choices. Due to the large amount of samples and calculations involved in Monte-Carlo simulation, two kinds of acceleration options are provided besides the fundamental field solver option. Thus, there are three choices for computing output parameters: (1) a brute-force field solver, which is the most accurate computation method but the slowest method, especially for large amounts of samples; (2) a table-lookup and interpretation, which is multidimensional linear interpolation method; and (3) equation fitting, which is nonlinear equation fitting that is fastest but quite difficult to obtain. Exemplary equation fitting is described in D. Sylvester and C. Hu, "Analytical Modeling and Characterization of Deep-Submicron Interconnect," Proceedings of the IEEE, Vol. 89, May 2001, p. 634-664, the disclosure of which is hereby incorporated by reference.

The brute force field solver is the most accurate method, but it is also the most time consuming one and might not be applicable for large amount of samples. The table lookup option is based on a field solver and multidimensional interpolation. The table lookup option can reduce the computational time significantly. The more samples, the more efficient the table-lookup option is. The table lookup option can also reach a very high accuracy. The equation fitting option is based on empirical expressions. The equation fitting option is the fastest method and can provide the user a quick overview of what is to be solved.

Figure 12:
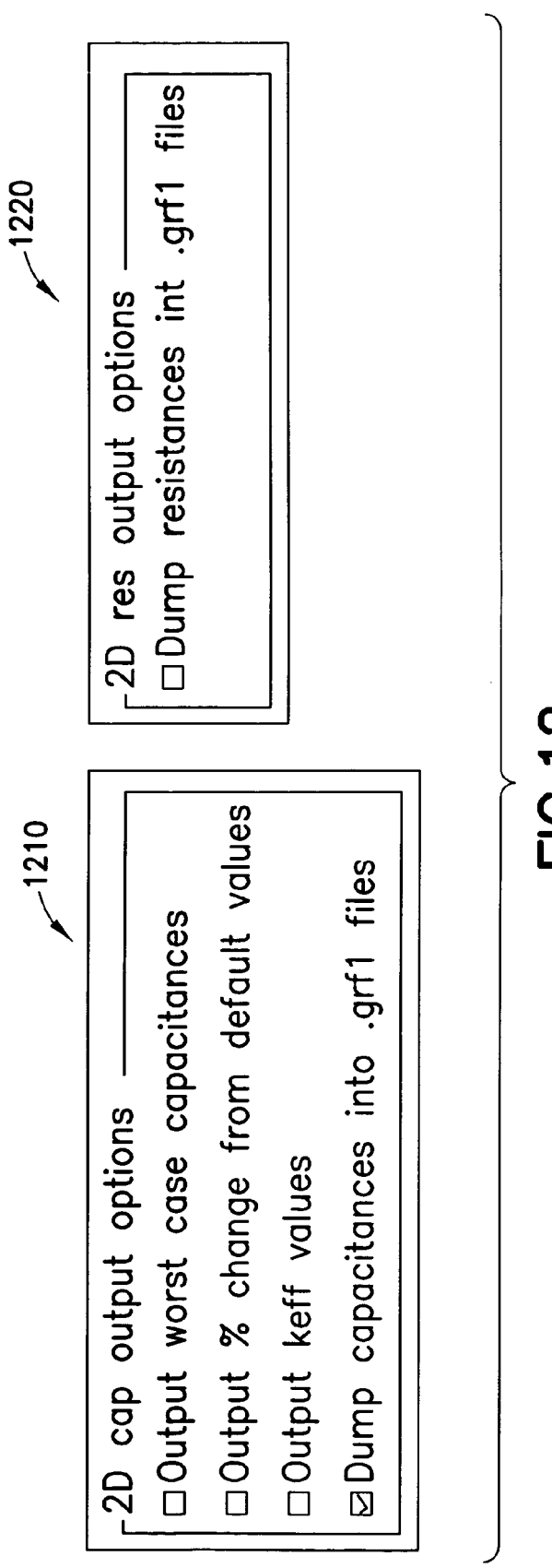
FIG. 12 shows exemplary representations of additional input screens used, for instance on FIG. 7B, to choose illustrative output parameter options.

FIG. 12 shows exemplary representations of additional input screens used to choose exemplary output parameter options. The input screen 1210 may be used (e.g., after step 450 of FIG. 4 or as part of "calculation options" tab 715 of FIG. 7B) to determine output options for the output parameter of capacitance. Under the 'Calculation options' tab 715 of FIG. 7B, the user can choose to dump the 1D capacitances into a graphics file and view a histogram using plotting software under the 'View' menu option (see FIG. 6). The input screen 1220 may be used (e.g., after step 450 of FIG. 4 or as part of "calculation options" tab for a resistance input screen) to determine output options for the output parameter of resistance. Other input screens may be derived for other electrical or performance output parameters.

As described above, sets of values for distributions for input parameters are selected and are used for calculations for a simulated interconnect circuit. Each calculation determines one or more output parameters. FIGS. 5-12 described input or modification of input parameters, and FIGS. 13-16 describe presentations to a user of output parameters.

Turning to FIG. 13 with appropriate reference to FIG. 5, FIG. 13 shows an exemplary representation of an output parameter presentation for an output parameter of capacitance, the output parameter determined using an independent variable analysis (e.g., the radio button 781 of FIG. 7A was selected). The layer was the metal layer M3 530 and calculations were performed for the interconnect 550 of FIG. 5. "Variable 1" is the input parameter of total thickness of the metal layer M3 530 and "Variable 2" is the input parameter of signal width (e.g., the width of interconnects carrying signals and not power or ground) of the interconnects 5545, 550, and 555. In this example, there were two samples for Variable 1 of 0.169608 and 0.165811. The value of 0.175000 for Variable 1 is a nominal value. There were two samples for Variable 2 of 0.108370 and 0.105005, while the value of 0.100000 for Variable 1 is a nominal value. Four values of the output parameters of Cleft, Cright (not shown), Cup (not shown), and Cdown (not shown) were produced. As described above in reference to FIG. 5, one typical output parameter to be calculated might be the total capacitance of the center interconnect 550. The total capacitance can be calculated, for example, as addition of the capacitance ("Cright") between the interconnects 550 and 555, the capacitance (Cleft) between the interconnects 550 and 545, the capacitance (Cup) between the interconnect 550 and the metal layer M4 515, and the capacitance (Cdown) between the interconnect 550 and the metal layer M2 540.

In FIG. 13, the total capacitance for the interconnect 550 as a function of total thickness (i.e., Variable 1) is 1.46835 and the tolerance is 0.0265801. These values were determined by using the two samples for Variable 1 of 0.169608 and 0.165811 and the nominal value of 0.100000 for Variable 2. The total capacitance for the interconnect 550 as a function of total thickness (i.e., Variable 1) is 1.5171 and the tolerance is 0.032541. These values were determined by using the nominal value of 1.75000 for Variable 1 and the two samples for Variable 2 of 0.108370 and 0.105005. Note that in FIG. 13, there are no two sets of values for Variable 1 and Variable 2 that are the same. Thus, FIG. 13 shows an independent analysis.

FIG. 14 shows an exemplary representation of an output parameter presentation for an output parameter of capacitance, the output parameter determined using either a simultaneous variable analysis or a full matrix variable analysis (e.g., a radio button 782 or 783, respectively, of FIG. 7A was selected). As with FIG. 13, "Variable 1" is total thickness of the metal layer M3 530 and "Variable 2" is the signal width (e.g., the width) of the interconnects 545, 550, and 555. For this example, a sample is selected for Variable 1 (e.g., of 0.188220), then samples are selected for Variable 2 (e.g., 0.110883 and 0.110894) and one calculation is performed for each of the samples in Variable 2. This results in a number of outputs for the selected output parameter equivalent to the number of samples of Variable 2. In this case, two samples of Variable 2 are selected, so there are two outputs (e.g., 0.5379260 and 0.5379260) corresponding to the two samples of Variable 2. Another sample (e.g., 0.185416) is selected for Variable 1, and calculations are performed again with the two samples from Variable 2. One resultant total capacitance (an output parameter) is produced, as is its tolerance.

Figure 15:
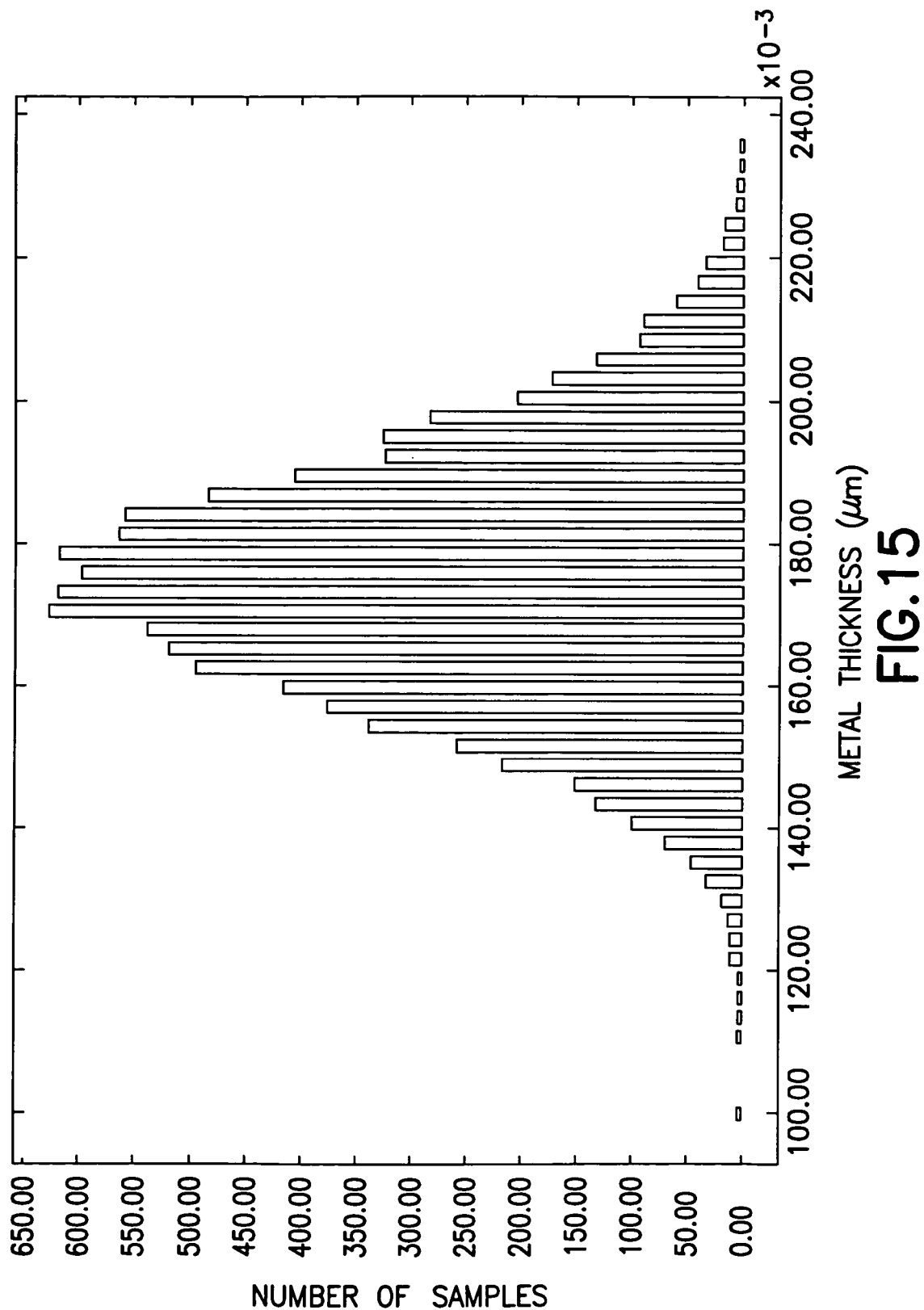
FIG. 15 is an exemplary plot of a histogram for the output parameter of metal thickness for a selected interconnect in the simulated interconnect circuit.

When the number of samples is small, the presentations shown in FIGS. 13 and 14 are fine. When the number of samples increases, though, histograms may be used. FIGS. 15 and 16 are examples of presentation of values for output parameters though histograms.

Figure 16:
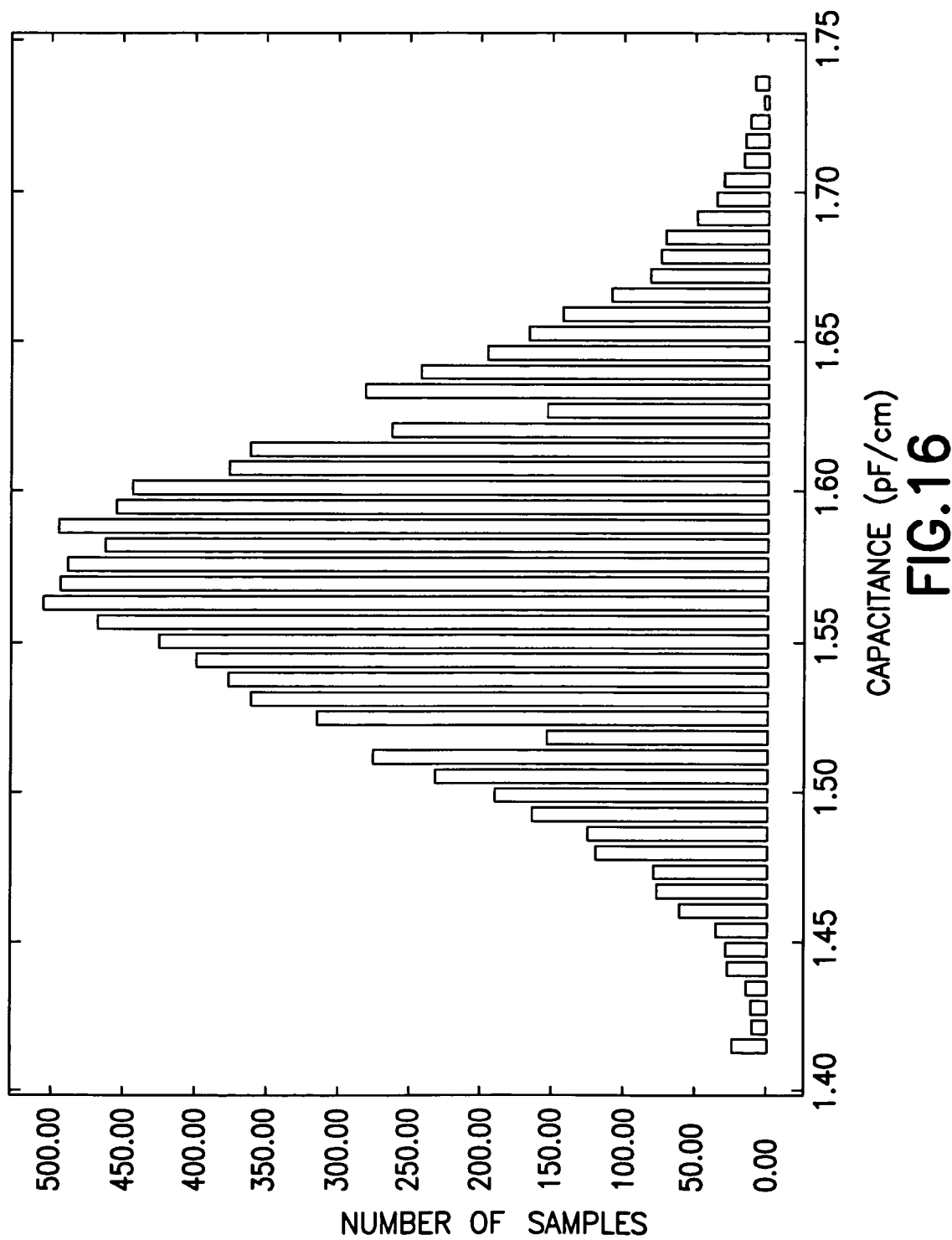
FIG. 16 is an exemplary plot of a histogram for the output parameter of capacitance for a selected interconnect in the simulated interconnect circuit.

FIG. 15 is an exemplary plot of a histogram for the output parameter of metal thickness for a selected interconnect (e.g., interconnect 550 of FIG. 5) in the simulated interconnect circuit. In this example, a number of calculations were performed for many samples, and values for the output parameter of metal thickness were put into bins, each bin corresponding to a range of values for metal thickness. FIG. 16 is an exemplary plot of a histogram for the output parameter of capacitance for the interconnect. As with FIG. 15, a number of calculations were performed for many samples, and values for the output parameter of capacitance were put into bins, each bin corresponding to a range of values for capacitance.

The histograms of FIGS. 15 and 16 may be used by designers to determine how manufacturing uncertainty affects semiconductor circuits (e.g., and their corresponding interconnect circuits) manufactured by processes used by manufacturing. An "ideal" histogram would have a very narrow range around a mean (i.e., the tolerances would be very small). If the range is large, then designers can make changes in the process itself based on analyses by embodiments of the present invention. For instance, perhaps reducing variability of a processing step (such as etching or deposition of an insulating layer) would decrease tolerances of an output parameter.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

Furthermore, some of the features of the preferred embodiments of this invention could be used to advantage without the corresponding use of other features. As such, the foregoing description should be considered as merely illustrative of the principles of the present invention, and not in limitation thereof.

What is claimed is:

1. A computer implemented method for determination of parameter variability for one or more given interconnects of a plurality of interconnects in a simulated semiconductor circuit, the simulated semiconductor circuit defined at least in part by a plurality of input parameters, the method comprising:
   determining, from a distribution of first values of a given input parameter, a plurality of the first values to use when calculating a corresponding plurality of second values for each of one or more output parameters;
   calculating, by using at least the determined plurality of first values for the given input parameter and selected values for other input parameters in the plurality of input parameters, the corresponding plurality of second values for each of the one or more output parameters, wherein the one or more output parameters correspond to the one or more given interconnects wherein each of the second values corresponds to at least one of the determined plurality of first values, wherein the plurality of input parameters comprises a metal layer thickness and a via layer thickness, wherein the metal layer thickness and the via layer thickness are correlated, correlation of which is defined at least in part by a correlation coefficient accounting for how modification of one affects the other, and wherein calculating is performed using the correlation coefficient for the correlated metal layer thickness and via layer thickness; and
   presenting on at least one display the plurality of second values to a user.

2. The method of claim 1, wherein the plurality of input parameters comprise one or more of design parameters and process parameters.

3. The method of claim 1, further comprising:
   allowing a user to select a nominal analysis or a statistical analysis;
   performing the steps of determining and calculating in response to a statistical analysis being selected; and
   performing the following steps in response to a nominal analysis being selected:
   selecting nominal values for the plurality of input parameters; and
   determining, by using the selected nominal values, a value for each of the one or more output parameters.

4. The method of claim 3, wherein the step of allowing a user to select a nominal analysis or a statistical analysis further comprises the step of allowing a user to select both the nominal analysis and the statistical analysis.

5. The method of claim 1, wherein the step of calculating further uses Monte Carlo analysis.

6. The method of claim 5, wherein the Monte Carlo analysis comprises a correlated Monte Carlo analysis.

7. The method of claim 1, wherein the step of calculating further comprises one of the following steps: independently varying values for each of the input parameters during the calculation step; simultaneously varying values for two or more of the input parameters during the calculation step; or simulating a full matrix comprising all of the input parameters during the calculation step.

8. The method of claim 1, wherein the step of calculating further uses one of a brute-force field solver, a table-lookup and interpretation, or equation fitting.

9. The method of claim 1, wherein the method further comprises the step of allowing a user to select the distribution of first values of the given input parameter from one or more provided distributions.

10. The method of claim 9, wherein the distribution of first values of the given input parameter has a mean and a tolerance and wherein the method further comprises the step of allowing the user to modify the mean, the tolerance, or both the mean and the tolerance.

11. The method of claim 1, wherein the distribution of first values of the given input parameter comprises a Gaussian distribution, a uniform distribution, a triangular distribution, or a log-normal distribution.

12. The method of claim 1, wherein the step of determining further comprises the step of automatically determining, using the distribution of first values of the given input parameter, a number of the first values to use in order to meet a predetermined confidence level when calculating the corresponding plurality of second values for each of the one or more output parameters.

13. The method of claim 12, wherein:
   the method further comprises the step of allowing the user to override the automatically-determined number of the first values to be used when calculating the corresponding plurality of second values for each of the one or more output parameters and thereby input a number of the first values to use when calculating the corresponding plurality of second values for each of the one or more output parameters; and
   the step of calculating further uses the user-inputted number of first values for the given input parameter.

14. The method of claim 12, wherein the step of automatically determining further comprises the step of automatically determining, using the distribution of first values of the given input parameter and by using the Central Limit Theorem, a number of the first values to use when calculating the corresponding plurality of second values for each of the one or more output parameters.

15. The method of claim 1, wherein the step of presenting further comprises the step of presenting the plurality of second values to the user by using a histogram.

16. The method of claim 1, wherein the selected values for the other input parameters comprise one or more of best-case, nominal, and worst-case values.

17. The method of claim 1, further comprising: outputting, based on the calculated corresponding plurality of second values for each of the one or more output parameters, a first file and a second file, wherein the first file comprises first information for resistance as a function of frequency and the second file comprises second information for inductance as a function of frequency.

18. The method of claim 1, further comprising:
enabling a user to specify the metal layer under testing;
automatically correlating the via layer with the specified metal layer, wherein the via layer is immediately above the specified metal layer; and
enabling a user to set a correlation coefficient to account for how an etching process common to the metal layer and the via layer will correlate the metal layer thickness and the via layer thickness.

19. The method of claim 1, wherein at least one of the input parameters comprises a process parameter, where the at least one of the input parameters comprising a process parameter comprises at least one of a dielectric constant and a metal resistivity.

20. The method of claim 1, wherein at least one of the output parameters comprises an electrical parameter of the one or more given interconnects, where the at least one of the output parameters comprising an electrical parameter of the one or more given interconnects comprises at least one of capacitance, resistance, resistance-capacitance time constant, impedance, inductance, a function of impedance over a range of frequencies and a function of inductance over a range of frequencies.

21. The method of claim 1, where at least one of the output parameters comprises a performance parameter of the one or more given interconnects, where the at least one of the output parameters comprising a performance parameter of the one or more given interconnects comprises at least one of delay, transition time, power, area and crosstalk.

* * * * *